United States Patent [19]

Janousek et al.

[11] Patent Number: 4,564,425

[45] Date of Patent: Jan. 14, 1986

[54] ELECTROCHEMICAL ETCHING OF A MERCURY-CADMIUM-TELLURIDE SUBSTRATE

[75] Inventors: Bruce K. Janousek, Los Angeles; Richard C. Carscallen, Torrance, both of Calif.

[73] Assignee: The Aerospace Corporation, Los Angeles, Calif.

[21] Appl. No.: 481,894

[22] Filed: Apr. 4, 1983

[51] Int. Cl.$^4$ .................. C25D 11/32; C25F 3/12; C25F 3/30

[52] U.S. Cl. .................. 204/34.5; 204/129.35; 204/129.7; 204/129.85

[58] Field of Search ............ 204/129.1, 129.3, 129.35, 204/129.75, 129.85, 325, 129.7, 34.5, 129.95

[56] References Cited

U.S. PATENT DOCUMENTS

| | | | |
|---|---|---|---|
| 2,861,932 | 11/1958 | Pohl | 204/129.7 |
| 2,904,479 | 9/1959 | McCord et al. | 204/129.7 |
| 3,898,141 | 8/1975 | Ermanis et al. | 204/34.5 |
| 3,977,018 | 8/1976 | Catagnus et al. | 204/15 |
| 4,441,967 | 4/1984 | Pohlmann et al. | 204/29 |

OTHER PUBLICATIONS

Manly et al, *Semiconductor Surfaces*, Wiley and Sons, Inc, New York, 1965, pp. 117–122.
Nemirovsky et al, "Anodic Oxide Films on $Hg_{1-x}Cd_xTe$", *J. Electrochem Soc*, May, 1979, pp. 768–770.
Thrush, "A Method for Selective Substrate Removal from Thin P-Type Gallium Arsenide Layers", Journal of Physics E., vol. 7, No. 6, pp. 493–495, Jun. 1974.

*Primary Examiner*—Thomas Tufariello
*Attorney, Agent, or Firm*—Ronald L. Taylor

[57] ABSTRACT

In this disclosure there is described a novel method for using electrochemical etching to finely polish the surface of a (Hg,Cd)Te substrate resulting in a defect-free infrared detector with enhanced electronic properties. The fine surface polishing is obtained by etching at optimal levels of current density and electrolyte agitation.

15 Claims, 3 Drawing Figures

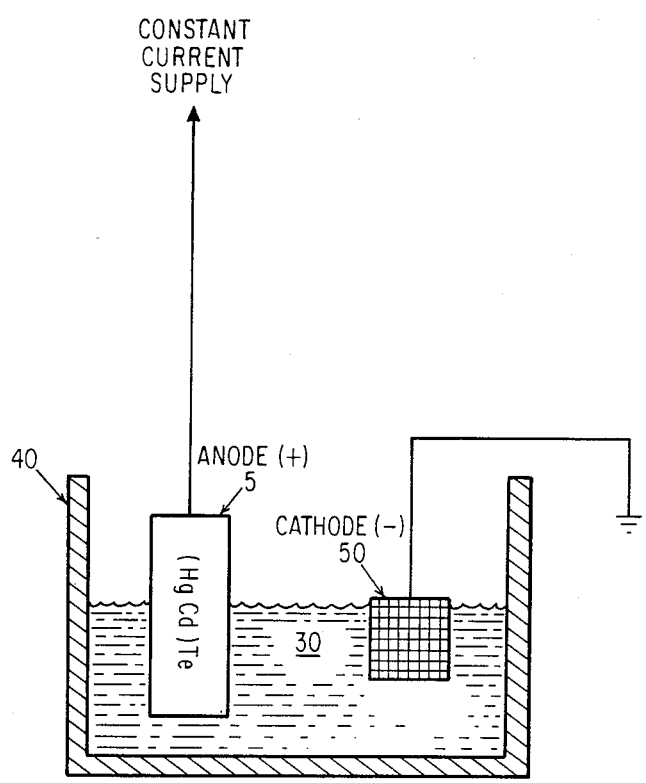

TABLE I.
ESTIMATE OF THICKNESS OF OXIDE FILM PRESENT DURING ELECTRO-ETCH

| CURRENT DENSITY ($\mu$amp/cm$^2$) | $V_P$ (vs PT) | $V_P'$ | $\Delta V_P'$ | $R(\Omega\text{-cm}^2)$ | $\rho(\Omega\text{-cm})$ | THICKNESS (Å) |
|---|---|---|---|---|---|---|
| 1.5 | 0.465 | 0.464 | 0.054 | $3.60 \times 10^4$ | $1.67 \times 10^{12}$ | 2.2 |
| 2.5 | 0.510 | 0.509 | 0.099 | $3.96 \times 10^4$ | $1.00 \times 10^{12}$ | 4.0 |
| 3.7 | 0.555 | 0.554 | 0.144 | $3.89 \times 10^4$ | $6.76 \times 10^{11}$ | 5.8 |
| 5.0 | 0.595 | 0.593 | 0.183 | $3.66 \times 10^4$ | $5.00 \times 10^{11}$ | 7.3 |
| 6.2 | 0.620 | 0.618 | 0.208 | $3.35 \times 10^4$ | $4.03 \times 10^{11}$ | 8.3 |
| 7.5 | 0.630 | 0.627 | 0.217 | $2.89 \times 10^4$ | $3.33 \times 10^{11}$ | 8.7 |
| 8.7 | 0.640 | 0.637 | 0.227 | $2.61 \times 10^4$ | $2.87 \times 10^{11}$ | 9.1 |
| 10.0 | 0.650 | 0.646 | 0.236 | $2.36 \times 10^4$ | $2.50 \times 10^{11}$ | 9.4 |
| 20.0 | 0.700 | 0.693 | 0.283 | $1.42 \times 10^4$ | $1.25 \times 10^{11}$ | 11.4 |
| 30.0 | 0.725 | 0.714 | 0.304 | $1.01 \times 10^4$ | $8.33 \times 10^{10}$ | 12.1 |

ELECTROCHEMICAL ETCHING OF A MERCURY-CADMIUM-TELLURIDE SUBSTRATE

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

This invention relates generally to the field of polishing infrared detector surfaces and specifically to electro-etching the surface of a mercury-cadmium-telluride ((Hg,Cd)Te) substrate.

2. Prior Art

In the past, polishing the surface of a semiconductor substrate to achieve a smooth surface has been accomplished by pure chemical etching. This was sufficient for relatively coarse smoothing but was inadequate for fine smoothing as required for an infrared detector of (Hg,Cd)Te. In the present case, the density of detectors and the intrinsic nature of the detector itself demands a degree of polishing unknown before. In particular, the semiconductor substrate surface of infra-red detectors in space satellite applications require a degree of polishing smoothness that cannot be achieved by mere chemical etching in order to achieve the desired sensitivity.

It has been known that electro-etching had the potential for fine smoothing/polishing etching, but till now was very difficult to control due to the propensity of the etching process to incur unwanted oxide growth on the object being etched. Accordingly, there was a need for a controlled process using electro-etching that could be combined with chemical etching for fine and coarse etching respectfully to achieve a greatly enhanced polished surface of a (Hg,Cd)Te infrared detector.

SUMMARY OF THE INVENTION

It is an important object of the invention to polish the surface of a (Hg,Cd)Te substrate through the process of electro-chemical etching to achieve enhanced electronic properties in its use as an infrared detector.

It is yet another object of the invention to electro-chemical etch the (HgCd)Te substrate by holding the current density to a predetermined level in an agitated viscous electrolyte having a relatively low pH thereby allowing the surface of the (HgCd)Te substrate to dissolve and oxidize simultaneously as the oxide diffuses into solution in the electrolyte.

BRIEF DESCRIPTION OF THE DRAWINGS

Various other objects, advantage, and meritorious features of the invention will become more fully apparent from the following specification, appended claims and accompanying drawing sheets in which like reference numerals designate corresponding parts:

FIG. 3 is a schematic view of the components used in the anodization procedure.

DESCRIPTION OF THE PREFERRED EMBODIMENT

Figure 1:
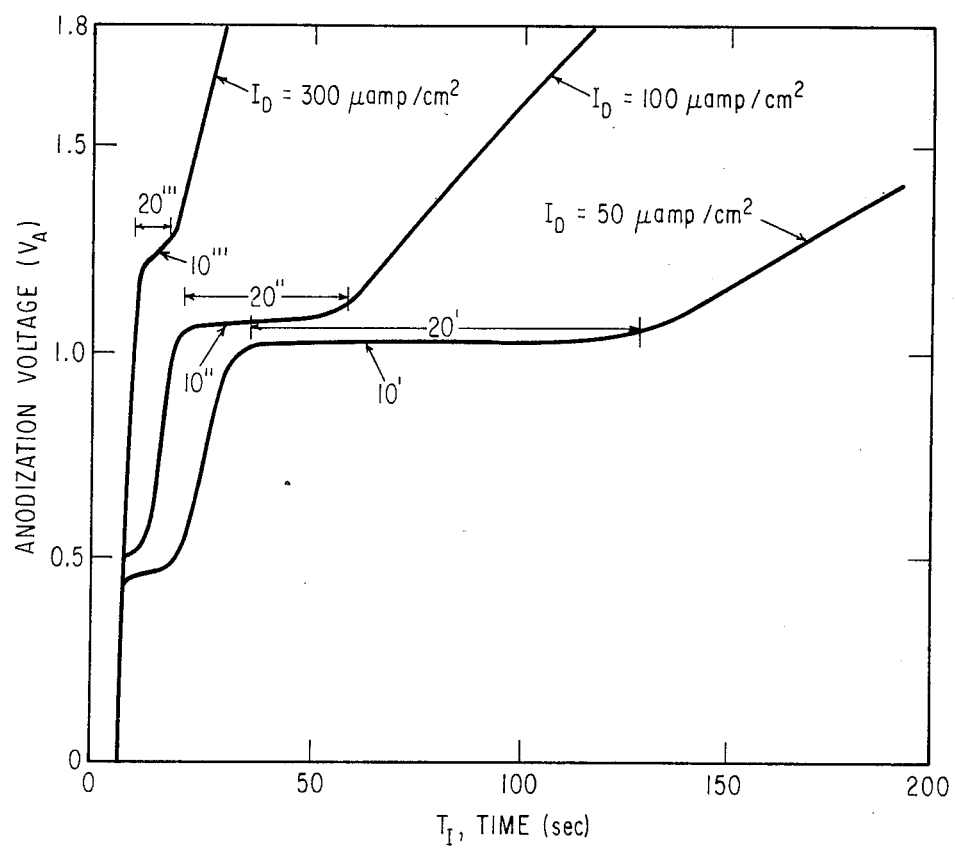
FIG. 1 is a plot of anodization voltage versus time.
Figure 2:
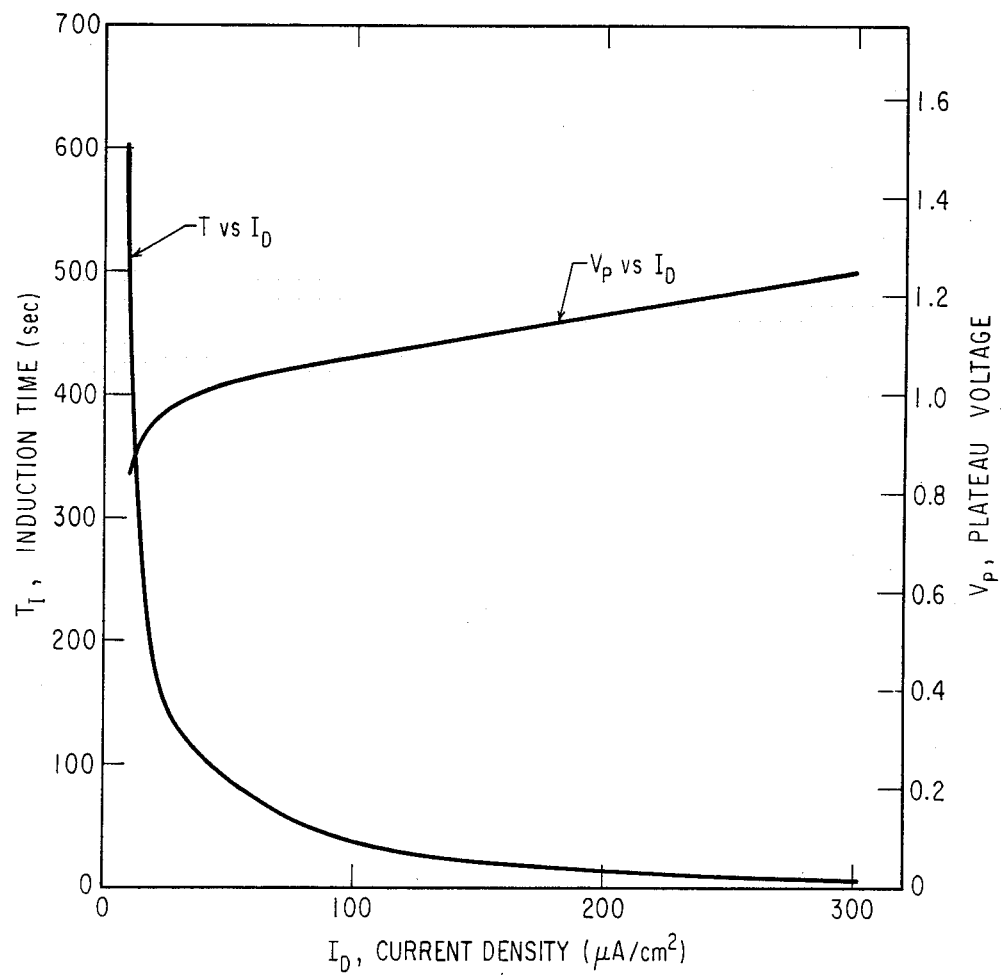
FIG. 2 is a plot of plateau voltage vs. current density.

Referring to FIGS. 1-3, it has been determined that initial anodic formation of native oxide on a mercury cadmium telluride hereinafter (Hg,Cd)Te semiconductor substrate or anodes 5 at FIG. 3 occurs via a dissolution-precipitation mechanism. Anodization voltage vs. time plots in FIG. 3. plateaus (10', 10'', 10''') indicative of the semiconductor substrate dissolution can be understood quantitatively in terms of the diffusion of dissolved species away from the anode 5. When the electrolyte 30 of the anodization cell 40 of FIG. 3 is stirred, the concentration build-up of dissolved species near the anode 5 is prohibited and precipitation will not occur. Under these conditions, the surface of the semiconductor substrate or anode 5 is being electro-chemically polished. The maximum current density which can be sustained through time in the stirred anodization cell 40 without oxide formation on the anode 5 is approximately—80 $\mu$amp/cm$^2$ which results in a maximum electro-chemical etch rate of 64 angstroms/min.

In particular, if the anodization is carried out using a platinum counter-electrode or cathodes, as shown in FIG. 3, at the recommended current density of 300 $\mu$A/cm$^2$, the anodization voltage ($V_A$) vs. time may be seem to be nearly linear, and in fact shows a reproducible plateau (10' 10'', 10''') at a cell voltage of 1.25 volts or $V_p$, as shown in FIG. 1. It has been determined that both the voltage of the plateau $V_p$, and the length (20', 20'', 20''') of the plateau (10', 10'', 10''') are functions of the anodization current density $I_D$. This is illustrated in FIG. 1 with the data summarized in FIG. 2.

The relationship between the length (20', 20'', 20''') of the plateau (10', 10'', 10''') and the current density $I_D$ can be understood in terms of a dissolution-precipitation process. In this process an induction time, $T_I$, equivalent to length (20', 20'', 20''') is associated with the formation of a precursor surface film which is produced in two steps. First, the (Hg,Cd)Te Anode 5 is partially dissolved electrochemically via oxidation of at least one of the three components (Hg,Cd, or Te) of the semiconductor anode 5. Secondly, this dissolution continues until the metal ion concentration in the electrolyte 30 near or spatially proximate the anodes electrode 5 reaches the limit of the solubility of the ion (or ions) and a precipitate forms on the partially dissolved electrode 5. Thus, the induction time (20', 20'', 20''') is expected to be longer at lower current densities, $I_D$, where the dissolving species are allowed to diffuse away from the anode 5, see FIG. 2. It will also be noted for the process, that the anodization voltage $V_A$ remains at $V_p$ indefinitely, $T_I$, induction time approaching infinity) if the anodization cell 40 is stirred at a predetermined rate sufficient to constitute agitation of the electrolyte. Under these conditions, of course, the concentration of a dissolving species is not allowed to build up near the anode 5 and thus precipitation does not occur. If the stirring of the electrolyte 30 is stopped during the dissolution process, $V_A$ will increase due to oxide formation on the anode 5 and further stirring produces no effect, insomuch as oxide formation will continue.

The dependence of induction time, $T_I$, on current density, $I_D$, obeys the relationship expected for a diffusion process. For the dissolution process, the concentration, C, of dissolving species in the electrolyte 40 at the surface of the anode 5 is expressed by $$C = C_o + \frac{2it^{\frac{1}{2}}}{nF\pi^{\frac{1}{2}}D^{\frac{1}{2}}}$$

where $C_o$ is the bulk ion concentration in the electrolyte 40,; i(=$I_D$) is the current density, t(=$T_I$) is the induction time, n is the number of electrons involved in the dissolution reaction, and D is the diffusion coefficient of the ion. At low current densities for the data presented in FIG. 2, the product of the current density i and the square root of the induction time t is a constant, which is expected from the supra equation.

It may be concluded, therefore, that during the dissolution phase of the dissolution-precipitation process the (Hg,Cd)Te anode 5 is being etched electrochemically. Electro-etching as a surface smoothing technique is possible due to the fact that the electric field will be greatest at raised areas on the semiconductor surface such as the anode 5 and the current density $I_D$ for dissolution will be higher in these areas. For an anode 5 made of (Hg,Cd)Te, the maximum current density, $I_D$ which can be sustained in the stirred anodization cell 40 without an upturn in the anodization voltage $V_A$ is approximately 80 μamp/cm². For a lattice constant, $a_o$, of 6.5 angstroms (with the face-centered cubic sublattices displaced by $\frac{1}{4}a_o$), and assuming that two electrons must be removed from the crystal for the oxidation of a single atom, the maximum electro-etch rate is estimated to be 64 angstroms/mn.

The trend in the plateau voltage (10', 10'', 10'''), $V_p$, as a function of current density, $I_D$, is evidence for an incipient oxide film which is present on the surface of the (Hg,Cd)Te anode 5 during the electro-etch process. Other possible causes of this voltage drop, such as the voltage drop of the electrolyte 30, or a current-density dependent over-potential at the cathode 50, do not account for the observed trend in $V_p$. For example, the resistivity of the anodization or electrolyte 30 has been determined to be 1.4×10² ohm-cm. While this resistivity will result in a significant voltage drop (approximately 0.1 volt for a current density of 300 μA/cm² and an electrode spacing of 2.54 cm), this drop does not account for the trend observed in $V_p$. Furthermore, the expected reaction at the platinum cathode 50,

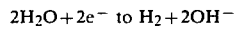

is not expected to have a large over-potential associated with hydrogen evolution due to the low current densities, $I_D$, employed.

In Table I, there is shown the results of an estimate of the thickness of the oxide film which is present on the surface of the anode 5 during the electrochemical etch. $V_P'$ is the plateau voltage corrected for the electrolyte solution 30 voltage drop and Delta $V_p'$ is the difference between $V_p'$ and 0.410 volts which is the value of $V_p$ extrapolated to zero current density, $I_D$ R is the resistance of the oxide film on the surface of the anode 5 which is $V_p'$ divided by the current density, $I_D$, while p (RHO) is the resistivity expected of the oxide film. It has been observed that the ratio of the anodization voltage, $V_A$, to oxide thickness on the (Hg,Cd)Te anodes is virtually independent of current density, $I_D$, for the growth of thick films of oxide. It may be assumed that the resistivities of the thin films of oxide present at the initial stages of anodization obey the same voltage: thickness ratio (0.025 volts/angstroms as the thick films of oxide and these can be used to calculate the resistivities shown in Table I by dividing the voltage: thickness ratio by the current density, $I_D$. In addition, the oxide film thicknesses on the anodes, as shown in the last column of Table I, are arrived at by dividing the resistance of the film, R, by its resistivity, p (RHO). The result shown in Table I is consistent with the presence of approximately a monolayer of native oxide on the surface of the anode 5 during the electro-chemical etch. Furthermore, it may also be shown that once the plateau region (10', 10'', 10''') is reached in an anodization, the same plateau voltage ($V_p$) current density ($I_D$) relationship as shown in Table 1 is observed simply by adjusting the current density, $I_D$, to either higher or lower values while in the plateau region (10', 10'', 10'''). This would indicate that the thickness of the thin oxide film on the anodes is not a function of the anodization current density, $I_D$. However, this result does not contradict the notion that this film of oxide on the surface of the anode 5 is approximately one monolayer in thickness as indicated supra.

The (Hg,Cd)Te electrochemical oxidation reactions are as follows. Cadmium, being the most electropositive of the three elements in the semiconductor anode 5, will be the most easily oxidized so that the initial oxidation reaction under constant current conditions is cadmium oxidation to Cd+² and HCdO₂ as represented by the cadmium (Cd) oxidations:

The Cd(OH)₂ formed by this reaction constitutes the monolayer of oxide present on the surface of the anode 5 during the electrochemical-etch. The actual and predominant electrochemical-etch reaction involves the Telluride (Te) oxidation:

This reaction continues until the solubility product of CdTeO₃ is reached. It will be appreciated that the Cd+² comes from the oxidation of Cd to Cd+² and or from the dissolution of Cd(OH)₂ at which point precipitation occurs on the surface of the anode 5 and a bulk oxide growth process on the surface of the anode 5 begins. It will be noted that the mercury (Hg) of the (HgCd)Te is not etched away from the anode 5, but rather is displaced or falls out into the electrolyte solution 30 for lack of spatial on structural support insomuch as the surrounding Cd and Te has been etched away from the surface of the anode 5.

Further bulk oxide growth on the surface of the anode 5 may then continue via metal cation field-assisted transport through the oxide-film to the oxide surface or hydroxyl anion transport via successive jumps.

The mechanism of bulk oxide growth has been determined by growing the oxide on the surface of the anode 5 sequentially in the regular anodizing electrolyte solution 30 at concentrations of 0.1M (Molar) potassium hydroxide (KOH) in 90% ethylene gylcol/10% H₂O, and then in a solution which has been isotopically labelled with oxygen-18. To differentiate between possible growth mechanisms, the isotopic distribution of the resultant oxide has been determined as a function of depth using an ion microprobe mass analyzer (IMMA). The O¹⁸ oxide has been observed to grow on the outside of the oxide film on the surface of anode 5, indicating that oxide growth may occur via metal cation transport. However, there is significant amount of O¹⁸–O¹⁶ mixing around the mid-point of the oxide film which is due to hydroxyl anion transport via successive jumps. Since decreasing the energy of the primary sputter beam does not effect the degree of isotopic mixing, that anion transport is important in the bulk growth mechanism.

In addition, it has been also determined what the effect is of electro-polishing on the resultant (Hg,Cd)Te surface of anode 5 in regards to its electronic properties or sensitivities as an infrared detector. When electrochemical-polishing is performed subsequent to a one-minute chemical etch in 5% bromine-methanol Br$_2$/MeOH) followed by in situ oxide growth, the (Hg,Cd)Te surface of anode 5 recombination velocity and degree of slow charge trapping at the oxide-semiconductor interface at the surface are reduced compared to samples where no electro-etch has been performed. Furthermore, when the pure chemical etch is eliminated and the sample is electrochemical-etched prior to oxide growth on the surface of the anode 5, the oxide thereon exhibits a negative fixed charge. These results indicate that the surface preparation and the early stages of oxide formation have a profound effect on the resultant (Hg,Cd)Te anode 5 electronic properties. Also, since the initial oxide formation on the surface of anode 5 can be understood in terms of electrochemical parameters, the surface chemistry can be manipulated in a rational manner at this crucial stage and, therefore, direct control over the resultant (Hg,Cd)Te surface of anode 5 electronic properties can be gained.

In a particular embodiment, the electro-etch process has been employed in the fabrication of metal-oxide-semiconductor (MOS) structures in order to demonstrate the applicability of this method of infra-red device construction. In the initial embodiment, the (Hg,Cd)Te surface of anode 5 was not subjected to the normal Br$_2$/MeOH chemical etch, but instead the surface was electro-etched for 5,000 seconds at a current density ($I_D$) of 10 $\mu$A/cm$^2$. After the electro-etch period on the oxide surface of the anode 5, the oxide was grown to a thickness of 600 angstroms at a current density ($I_D$) of 300 $\mu$A/cm$^2$ followed by a constant voltage anneal at 12–14 volts for 20 minutes.

The electrochemical-etch has a profound effect on the oxide-semiconductor interface of a MOS structure. The baseline process on the surface of the anode 5 of Br$_2$/MeOH pure chemical etch followed by 300 $\mu$A/cm$^2$ growth consistently results in an oxide on anode 5 having a positive fixed charge, while an electrochemical-etched surface with no chemical pre-treatment will exhibit a negative fixed charge. Also, the capacitance change in going from accumulation to inversion is more gradual for the electrochemical-etched indicating an increase in the fast interface state density and/or the degree of oxide charge non-uniformity. These (Hg,Cd)Te surface electronic properties of the anode 5 were heretofore unattainable and, therefore, indicate that the electrochemical-etch process can be used as a polishing technique to achieve novel semiconductor surface properties.

In an alternative particular embodiment, MOS structures using a second passivation procedure have been fabricated to further demonstrate the applicability of the electrochemical-etch process. In this process, the (Hg,Cd)Te surface of the anode 5 may be given a one-minute chemical etch in 5% Br$_2$/MeOH, followed by an electrochemical-etch prior to oxide growth on the anode 5. The electrochemical-etch parameters and oxide growth conditions are identical to those used for the first embodiment described above. The resultant MOS structure prepared by this method will consistently display a non-equilibrium capacitance-voltage behavior in the inversion region. This non-equilibrium behavior is indicative of an extremely slow minority carrier generation rate. By observing the capacitance-transient behavior by pulsing the MOS structure into inversion, it has determined that the surface recombination velocity associated with these structures is very low, ranging from 10–100 cm/sec; these low values are not consistently attainable using the Br$_2$MeOH chemical etch without the electrochemical-etch. Low surface recombination velocities are consistent with a smooth, defect-free semiconductor surface on the anode 5. Therefore, the Br$_2$/MeOH-electrochemical-etch is a reproducible method for the (Hg,Cd)Te semi-conductor surface of anodes 5 polishing which results in enhanced (Hg,Cd)Te surface electronic properties.

It will be appreciated that reducing the concentration of dissolved components in the electrolyte 30 in an area that is spatially proximate to the surface of the semiconductor substrate of mercury-cadmium-telluride that serves as the electrode or anodes may be achieved by mechanical agitation such as stirring at a predetermined rate. The mechanical agitation is enhanced by making it relatively viscous by adding ethylene glycol at a concentration of approximately 90%. The preferred electrolyte is potassium hydroxide (KOH) with a concentration of 0.1M, and with the remainder of the concentration being water (10%).

Alternatively, the concentration of dissolved components in the electrolyte 30 spatially proximate to the anode 5 may be reduced by enhancing the diffusion in the electrolyte 30 by the means of relatively low viscosity due to a concentration of less than 90% ethylene glycol. In addition, the electrolyte 30 will have a relatively high $p$H, such as potassium hydroxide KOH, at a concentration greater than 0.1M, with the remainder of the electrolyte 30 being water.

It will be appreciated that for the relatively low $p$H-high viscosity electrolyte 30 as given supra, once the surface of the substrate anode 5 has been polished to the predetermined degree required, agitation will cease thereby allowing an oxide layer to form and grow on the surface to a predetermined depth at which point the current to the anode 5 will be shut off and/or the anode 5 will be removed for the electrolyte 30 thereby precluding further oxide growth on the surface. This oxide layer surface of the anode 5 is considered to be passivated. The oxide layer so formed will act as a protective barrier against outside destructive forces from affecting the infrared detector from functioning. The oxide layer on the anode 5 is transparent to infrared rays. It will be further appreciated that the supra $p$H is high in the absolute sense in all embodiments, and only relatively low or high as to one alternative embodiment compared to another.

From the foregoing description of a specific embodiment illustrating the fundamental features of the invention, it will now be apparent to those skilled in the art that the invention may be accomplished in a variety of forms without departing from the true spirit and scope thereof.

Accordingly, it is understood that the invention disclosed herein is a preferred embodiment thereof and that the invention is not to be limited thereby, but only by the appended claims.

What is claimed is:

1. A method of electro etching a substrate electrode having mercury-cadmium-telluride components, comprising:

(a) applying current density at a predetermined level within the range of 10–80 μamp/cm$^{-2}$ to the substrate electrode that has been immersed in an electrolyte having a viscosity element of ethylene glycol and a pH element of potassium hydroxide whose concentrations are inversely related to enable the components on the surface of the electrolyte to dissolve into the electrolyte; and (b) reducing the concentration of said dissolved components in the electrolyte that are spatially proximate to the substrate electrode for disallowing precipitation of said dissolved components onto the surface of the electrode.

2. The method as defined in claim 1 wherein reducing the concentration of dissolved components step comprises agitating the electrolyte at a predetermined rate.

3. The method as defined in claim 1 wherein the concentration of the viscosity element, ethylene glycol, in the electrolyte is greater than 90%.

4. The method as defined in claim 3 wherein the concentration of the potassium hydroxide, in the electrolyte is less than 0.1 Molar.

5. The method as defined in claim 1 wherein the concentration of potassium hydroxide is approximately greater than 0.1 Molar.

6. The method as defined in claim 5 wherein the ethylene glycol is at a concentration of less than 90%.

7. The method as defined in claim 1 comprising the step of chemical etching the surface of the substrate electrode prior to the step applying current density for coarse polishing of the surface.

8. The method as defined in claim 7 wherein said chemical etching is comprises applying a predetermined amount of bromine in methanol to the surface of the substrate electrode.

9. The method as defined in claim 1 comprising the step of growing a layer of oxide to a predetermined depth on the surface of the substrate electrode for passivating of the surface of the electrode subsequent to the step of reducing the concentration of dissolved components in the electrolyte.

10. A method of electro chemical etching the surface of a substrate anode having mercury-cadmium-telluride components for achieving a finely polished surface, comprising:

(a) applying current density at a predetermined level within the range of 10 to 80 μamp/cm$^{-2}$ to the substrate anode immersed in an electrolyte having potassium hydroxide and ethylene glycol at concentrations of approximately 0.1 Molar and 90% respectively to enable the components on the surface to dissolve electrochemically via oxidation into the electrolyte; and (b) agitating the electrolyte at a predetermined rate to disallow the concentration of the dissolved components to build up near the substrate anode thereby precluding precipitation on the surface.

11. The method as defined in claim 10 comprising the step of chemical etching the surface of the substrate anode prior to applying current density for coarse polishing of the surface.

12. The method as defined in claim 11 wherein the chemical etching comprises applying a predetermined amount of bromine in methanol to the surface of the substrate anode.

13. The method as defined in claim 10 comprising the step of growing a layer of oxide to a predetermined depth on the surface of the substrate anode for passivation of the surface of the anode subsequent to the step of reducing the concentration of dissolve components.

14. A method of etching the surface of a substrate anode having mercury cadmium and telluride components for achieving a finely polished surface, comprising:

(a) chemical etching the substrate anode for coarse polishing of the surface;

(b) electro-chemical etching, the substrate anode for fine polishing of the surface comprising;

(1) applying current density at a predetermined level within the range of 10–80 μamp/cm$^{-2}$ to the substrate anode immersed in an electrolyte having a $_p$H element of potassium hydroxide at a concentration of approximately 0.1 Molar and a viscosity element of ethylene glycol of approximately 90% to enable the components on the surface to dissolve electro-chemically via oxidation into the electrolyte; and (2) agitating the electrolyte at a predetermined level relative to the substrate anode to disallow the concentration of said dissolved components to build up spatially proximate to the anode during the electro-chemical etching thereby precluding precipitation of said dissolved components back onto the surface of the substrate; and (c) growing a layer of oxide to a predetermined depth on the surface of the substrate anode for passivation of the surface of the anode subsequent to the agitating for passivation of the surface.

15. The method as defined in claim 14 wherein the chemical etching comprises the step of applying a predetermined amount of bromine in methanol to the surface of the substrate anode.

* * * * *